United States Patent
Ohashi et al.

(10) Patent No.: US 8,182,923 B2
(45) Date of Patent: May 22, 2012

(54) CONDUCTIVE PASTE AND MOUNTING STRUCTURE USING THE SAME

(75) Inventors: Naomichi Ohashi, Hyogo (JP); Hidenori Miyakawa, Osaka (JP); Atsushi Yamaguchi, Osaka (JP); Arata Kishi, Osaka (JP); Takayuki Higuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 488 days.

(21) Appl. No.: 12/427,275

(22) Filed: Apr. 21, 2009

(65) Prior Publication Data

US 2009/0269598 A1 Oct. 29, 2009

(30) Foreign Application Priority Data

Apr. 23, 2008 (JP) ................................ 2008-112197

(51) Int. Cl.
*H01B 1/22* (2006.01)
*B32B 15/08* (2006.01)
(52) U.S. Cl. ........ 428/458; 252/500; 252/512; 427/123; 427/191; 427/201; 427/384
(58) Field of Classification Search .................. 428/458; 252/500, 512
See application file for complete search history.

(56) References Cited

U.S. PATENT DOCUMENTS 6,054,175 A * 4/2000 Akiha et al. .................. 427/123

FOREIGN PATENT DOCUMENTS

| JP | 10-279903 | | 10/1998 |
| JP | 2005-071825 | * | 3/2005 |
| JP | 2005-089559 | | 4/2005 |

* cited by examiner

*Primary Examiner* — Robert D. Harlan
(74) *Attorney, Agent, or Firm* — McDermott Will & Emery LLP

(57) ABSTRACT

A conductive paste includes a filler component and a flux component; the filler component including a first conductive filler and a second conductive filler having different melting points, and the melting point of the first conductive filler being higher than the melting point of the second conductive filler by 20° C. or more; the flux component including a first flux and a second flux having different melting points, the melting point of the first flux being higher than the melting point of the second flux, and the melting point of the first flux being higher than the melting point of the second conductive filler by 15° C. to 45° C.; and the melting point of the second flux being equal to or less than the melting point of the second conductive filler.

17 Claims, 1 Drawing Sheet

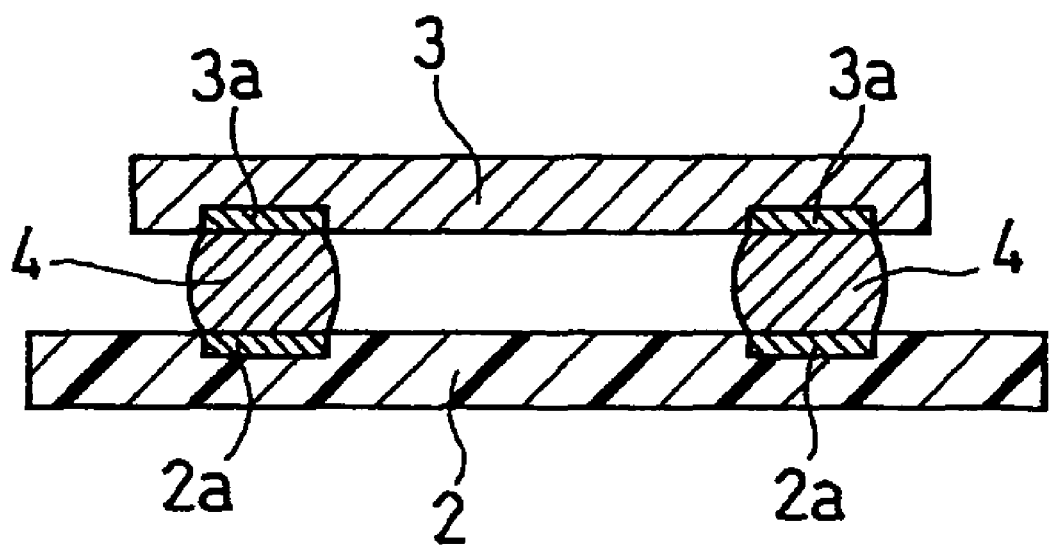

CONDUCTIVE PASTE AND MOUNTING STRUCTURE USING THE SAME

FIELD OF THE INVENTION

The present invention relates to a conductive paste containing two or more conductive fillers having different melting points and two or more fluxes having different melting points, and to a mounting structure using the conductive paste.

BACKGROUND OF THE INVENTION

In the field of circuit-forming techniques for electric devices or electronic devices, various conductive pastes are used when mounting electronic components onto a substrate. The conductive paste is a composition containing a conductive filler component and a resin component, and an electrical insulating resin is generally used for the resin component. Although the resin component does not exhibit electric conductivity, by curing and shrinking the resin component, the conductive fillers are brought into contact with or into proximity to each other, rendering the composition as a whole conductive.

By increasing the conductive filler content in the conductive paste, and increasing the contact area or contact probability between the conductive filler particles, the resistance of the conductive paste can be reduced. However, it is not sufficient to improve the contact state only in order to reduce the resistance of the conductive paste. Also, when electronic components are bonded to a substrate using a conductive paste and a thermal cycle reliability test is carried out, the resistance value of the joint portion after such a test increases compared with the initial value.

Thus, the use of a combination of a high melting point conductive filler and a low melting point conductive filler has been proposed. The low melting point conductive filler is melted at its melting point or higher temperatures and attached to the high melting point conductive filler, and forms a chain structure of the coupled filler particles. As a result, the mechanical strength of the joint portion is increased, and the reliability of the electrical connection is also increased to a certain degree (ref. Patent Document 1: Japanese Laid-Open Patent Publication No. Hei 10-279903).

It is also proposed that the surface of the conductive filler is melted and the conductive filler particles are welded to each other at the time of heating to cure the conductive paste. By welding the conductive filler particles, the reliability of the electrical connection at the joint portion is increased to a certain degree (ref. Patent Document 2: Japanese Laid-Open Patent Publication No. 2005-89559).

On the other hand, use of a conductive paste containing a thermosetting resin and a conductive filler as a potting compound for the via holes of a circuit board has been proposed. The conductive filler consists of low melting point metal particles with a melting point of 230° C. or less. The low melting point metal particles take the role of an electrical connection similar to solder, and the thermosetting resin reinforces the joint portion (ref. Patent Document 3: Japanese Laid-Open Patent Publication No. 2005-71825).

When electronic components are bonded to a substrate using a conductive paste, solder balls may be generated at the time of soldering. According to the results of various examinations conducted by the inventors, when the conductive paste contains two or more types of metal particles, the amount of the solder balls generated tends to be large, and this tendency is affected by fluxes. Particularly, a conductive paste containing a thermosetting resin and metal particles as conductive filler brings about dipping of the thermosetting resin easily, unlike a general soldering paste. Therefore, solder balls easily flow out from between the substrate and component electrodes. Furthermore, because the conductive paste containing a low melting point flux component has poor storage stability, and its viscosity varies greatly at ambient temperature, the handling of the paste is troublesome. Thus, there is an increasing demand for a conductive paste that does not easily generate solder balls when soldering, has excellent storage stability, and is capable of securing an excellent electrical connection.

BRIEF SUMMARY OF THE INVENTION

One object of the present invention is to suppress solder ball generation when soldering by using a conductive paste. Another object of the present invention is to improve the storage stability of the conductive paste at ambient temperature.

In view of the above situations, the present invention relates to a conductive paste including a filler component and a flux component, wherein the filler component includes a first conductive filler and a second conductive filler having different melting points, respectively; the melting point of the first conductive filler is higher than the melting point of the second conductive filler by 20° C. or more; the flux component includes a first flux and a second flux having different melting points, respectively; the melting point of the first flux is higher than the melting point of the second flux; and the melting point of the second flux is equal to or less than the melting point of the second conductive filler. The melting point of the first flux is higher than the melting point of the second conductive filler by 15° C. to 45° C.

The melting point of the first flux is preferably equal to or less than the melting point of the first conductive filler.

When the melting point of the first conductive filler is 120 to 140° C., the melting point of the second conductive filler is preferably 120° C. or less.

When the melting point of the first conductive filler is 190 to 230° C., the melting point of the second conductive filler is preferably 100 to 140° C.

In a preferable embodiment of the present invention, the ratio of the second flux relative to the total of the first flux and the second flux is 50% by mass or less, and 1.5 times or more the percentage by mass of the second conductive filler relative to the total of the first conductive filler and the second conductive filler.

In a preferable embodiment of the present invention, the ratio of the first conductive filler relative to the total of the first conductive filler and the second conductive filler is 75 to 90% by mass, more preferably 80 to 90% by mass, and particularly preferably 85 to 90% by mass.

In a preferable embodiment of the present invention, the total amount of the first conductive filler and the second conductive filler contained in the conductive paste is 75 to 90% by mass.

At least one of the first conductive filler and the second conductive filler preferably includes Sn and Bi, and more preferably, the first conductive filler and the second conductive filler both include Sn and Bi.

When the first conductive filler includes Sn and Bi, the Bi content of the first conductive filler is preferably 0.5 to 60 mol %.

When the second conductive filler includes Sn and Bi, the Bi content of the second conductive filler is preferably 55 to 70 mol %.

In a preferable embodiment of the present invention, the conductive paste further includes a thermosetting resin component and a curing agent component.

The present invention also relates to a mounting structure including a substrate, an electronic component that is mounted on the substrate, and the above-described conductive paste that bonds the electronic component to the substrate.

By using the conductive paste of the present invention, solder ball generation can be reduced more than the conventional soldering technique when soldering using a reflow furnace and the like, and also an excellent electrical connection can be ensured. The conductive paste of the present invention also has excellent storage stability at ambient temperature.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWING

FIG. 1 is a schematic cross-sectional view illustrating an example of a mounting structure including a conductive paste of the present invention.

DETAILED DESCRIPTION OF THE INVENTION

A conductive paste of the present invention contains a filler component and a flux component; the filler component contains a first conductive filler and a second conductive filler having different melting points; and the flux component contains a first flux and a second flux having different melting points. The melting point of the first conductive filler is higher than the melting point of the second conductive filler by 20° C. or more, and the melting point of the second flux is equal to or less than the melting point of the second conductive filler. The melting point of the first flux is higher than the melting point of the second flux, and higher than the melting point of the second conductive filler by 15° C. to 45° C.

When soldering, at a temperature equal to or less than the melting point of the second conductive filler, the reduction of the second conductive filler by the second flux advances. The second conductive filler that is reduced to a certain degree quickly melts upon reaching its melting point, and wets and spreads over the electrodes provided on the electronic components and the substrate. At that time, the melted second conductive filler also wets and spreads over the surface of particles of the first conductive filler having a higher melting point. This causes a portion of the first conductive filler to melt into the second conductive filler, improving the reliability of the electrical connection. Then, when the first flux reaches its melting point, the first flux accelerates the melting and mixing of the first conductive filler and the second conductive filler. As a result, the wetting and spreading of the whole filler component over the electrodes are accelerated, suppressing the generation of solder balls.

When the melting point of the second flux is higher than the melting point of the second conductive filler, the reduction of the second conductive filler barely advances before the second conductive filler reaches its melting point. Therefore, the second conductive filler cannot quickly melt, thus failing to wet and spread over the electrodes and the surface of the first conductive filler particles.

It is necessary that the melting point of the first conductive filler is higher than the melting point of the second conductive filler by 20° C. or more. When the difference between the melting point of the first conductive filler and the melting point of the second conductive filler is below 20° C., the significance of using two or more conductive fillers with different melting points diminishes, the effect of improving the reliability of an electrical connection cannot be obtained sufficiently, and voids may be generated at the joint portion.

The melting point of the first flux is preferably higher than the melting point of the second conductive filler by 15° C. to 45° C., and more preferably by 30° C. to 44° C. When the melting point of the first flux is higher than the melting point of the second conductive filler by within 15° C., most of the flux component may be consumed at around the melting point of the second conductive filler. Therefore, the flux component for reducing the first conductive filler cannot be reserved sufficiently, and the effect of decreasing solder ball generation is reduced. On the other hand, when the melting point of the first flux is higher than the melting point of the second conductive filler by more than 45° C., the diffusion of the melted second conductive filler to the first conductive filler may not sufficiently advance.

The ratio of the second flux relative to the total of the first flux and the second flux is preferably equal to or less than 50% by mass. When the ratio of the second flux exceeds 50% by mass, the amount of the first flux relatively decreases. Therefore, the first flux for reducing the first conductive filler may be insufficient when melting the first conductive filler and the effect of decreasing solder ball generation may be reduced.

Furthermore, the ratio of the second flux relative to the total of the first flux and the second flux is preferably 1.5 times or more the percentage by mass of the second conductive filler relative to the total of the first conductive filler and the second conductive filler. That is, when the ratio of the second flux relative to the total of the first flux and the second flux is $X$ % by mass, and the ratio of the second conductive filler relative to the total of the first conductive filler and the second conductive filler is $Y$ % by mass, the relationship $1.5Y \leq X$ is preferably satisfied.

By satisfying the relationship $1.5Y \leq X$, when the second conductive filler melts at its melting point or higher and wets and spreads over the adjacent surface of the first conductive filler, the diffusion of metal atoms occurs between the fillers. Therefore, formation of the composite of the second conductive filler and the first conductive filler is accelerated. On the other hand, when the relationship is $X < 1.5Y$, the reduction of the first conductive filler may not sufficiently advance, and the effect of decreasing solder ball generation is reduced.

The total amount of the first conductive filler and the second conductive filler contained in the conductive paste is preferably 75 to 90% by mass. When the total amount of the first conductive filler and the second conductive filler contained in the conductive paste is less than 75% by mass, the contact probability between the conductive fillers may decrease, and the amount of solder ball generation may greatly increase. When the total amount of the first conductive filler and the second conductive filler contained in the conductive paste is equal to or less than 90% by mass, solder balls tend to generate particularly easily. Therefore, the present invention is effective especially for the case where the total amount of the first conductive filler and the second conductive filler contained in the conductive paste is equal to or less than 90% by mass.

The ratio of the first conductive filler relative to the total of the first conductive filler and the second conductive filler is preferably 75 to 90% by mass. With the ratio of the first conductive filler exceeding 90% by mass, when the second conductive filler melts at its melting point, the amount of the second conductive filler that wets and spreads over the adjacent first conductive filler becomes small. Therefore, the effect of decreasing solder ball generation is reduced. On the other hand, when the ratio of the first conductive filler is less than 75% by mass, when the second conductive filler melts at its melting point, the amount of the second conductive filler forming composite with the adjacent first conductive filler becomes large. Therefore, a large portion of the filler component melts in the proximity of the melting point of the second conductive filler, and the effects of using two or more conductive fillers become less. The ratio of the first conductive filler relative to the total of the first conductive filler and the second conductive filler is more preferably 80 to 90% by mass, and particularly preferably 85 to 90% by mass.

The conductive paste of the present invention contains two or more fluxes having different melting points. Such a conductive paste has improved storage stability in ambient temperature compared with that of a conductive paste containing a single flux. The flux reacts with the conductive filler even at ambient temperature to a certain degree. However, a flux having a high melting point is low in reactivity with the conductive filler. Therefore, in the case of the conductive paste containing two or more fluxes, because the ratio of the flux that reacts with the conductive filler at ambient temperature decreases, the shelf life becomes longer.

At least one of the first conductive filler and the second conductive filler preferably is alloy particles containing Sn. The alloy particles preferably contain, other than Sn, at least one selected from the group consisting of Bi, In, Ag, and Cu; and a solder material is particularly preferable. Examples of the solder material include, to be specific, a Sn—Bi type alloy, a Sn—In type alloy, a Sn—Bi—In type alloy, a Sn—Ag type alloy, a Sn—Cu type alloy, a Sn—Ag—Cu type alloy, a Sn—Ag—Bi type alloy, a Sn—Cu—Bi type alloy, a Sn—Ag—Cu—Bi type alloy, a Sn—Ag—In type alloy, a Sn—Cu—In type alloy, a Sn—Ag—Cu—In type alloy, and a Sn—Ag—Cu—Bi—In type alloy. Particularly, in view of obtaining a conductive paste that has excellent wettability between fillers, a solder material containing Sn and Bi is particularly preferable. When the first conductive filler contains Sn and Bi, the Bi content is preferably 0.5 to 60 mol %. When the second conductive filler contains Sn and Bi, the Bi content is preferably 55 to 70 mol %.

The alloy particles are preferably spherical particles. The spherical particles can be obtained by preparing an alloy of a predetermined composition, and then granulating the alloy by an atomizing process, a tumbling granulation process, and the like. The average particle size (median size in volume-based particle size distribution) of the spherical particles is generally 20 to 40 μm.

From the alloy particles as described above, two or more types of alloy particles having different melting points are selected as the first conductive filler and the second conductive filler.

For the first conductive filler, alloy particles having a melting point of equal to or less than the temperature for heating and curing the conductive paste are selected. For the first conductive filler, alloy particles having a melting point of about 10° C. to 20° C. lower than the temperature for heating and curing the conductive paste are preferable.

For the second conductive filler, alloy particles having a melting point lower than the first conductive filler is selected. It is necessary that the melting point of the first conductive filler and the melting point of the second conductive filler are different from each other by 20° C. or more so that a time delay is provided between the start of melting for the first conductive filler and the start of melting for the second conductive filler even in the case where the rate of temperature increase fluctuates in the conductive paste at the time of heating.

For example, when the melting point of the first conductive filler is 120 to 140° C., the melting point of the second conductive filler is preferably equal to or less than 120° C., and particularly preferably 70 to 120° C. Furthermore, when the melting point of the first conductive filler is 190 to 230° C., the melting point of the second conductive filler is preferably 100 to 140° C.

For the first flux and the second flux, an organic acid, a halide salt of an amine, an organic acid salt of an amine, and the like that have a reduction ability for removing an oxide film at the surface of an electrode and alloy particles, i.e., adherends, in the temperature range for heating and curing the conductive paste are used. For example, a flux as described in JIS Z 3283 containing a rosin or a modified rosin as a main ingredient, and, as desired, a halide salt of an amine, an organic acid, an organic acid salt of an amine, and the like as an activation component may be used.

Examples of the organic acid include saturated aliphatic monocarboxylic acids such as lauric acid, myristic acid, palmitic acid, and stearic acid; an unsaturated aliphatic monocarboxylic acid such as crotonic acid; saturated aliphatic dicarboxylic acids such as oxalic acid, L(−)-Malic acid, malonic acid, succinic acid, glutaric acid, adipic acid, pimelic acid, suberic acid, azelaic acid, and sebacic acid; unsaturated aliphatic dicarboxylic acids such as maleic acid and fumaric acid; aromatic carboxylic acids such as phthalaldehydic acid, phenylbutyric acid, phenoxyacetic acid, and phenylpropionic acid; an ether dicarboxylic acid such as diglycolic acid; and other organic acids such as abietic acid and ascorbic acid.

Examples of the halide salt of an amine include amine hydrochlorides such as ethylamine hydrochloride, diethylamine hydrochloride, dimethylamine hydrochloride, cyclohexylamine hydrochloride, triethanolamine hydrochloride, and glutamic acid hydrochloride; and amine hydrobromides such as diethylamine hydrobromide, and cyclohexylamine hydrobromide.

From the above-described materials, two or more materials having different melting points are selected as the first flux and the second flux.

It is important to select a material having a melting point higher than that of the second conductive filler by 15° C. to 45° C. for the first flux.

It is important to select a material having a melting point equal to or lower than that of the second conductive filler for the second flux.

The conductive paste of the present invention may further contain a thermosetting resin component and a curing agent component.

For the thermosetting resin, for example, an epoxy resin, a urethane resin, an acrylic resin, a polyimide resin, a polyamide resin, a bismaleimide resin, a phenolic resin, a polyester resin, a silicone resin, and an oxetan resin may be included. These may be used singly, or may be used in a combination of two or more. Among these, the epoxy resin is particularly preferable.

For the epoxy resin, a bisphenol type epoxy resin, a multifunctional epoxy resin, a flexible epoxy resin, a brominated epoxy resin, a glycidylester type epoxy resin, and a high molecular weight type epoxy resin may be used. To be specific, a bisphenol A type epoxy resin, a bisphenol F type epoxy resin, a bisphenol S type epoxy resin, a biphenyl type epoxy resin, a naphthalene type epoxy resin, a phenol novolak type epoxy resin, and a cresol novolak type epoxy resin are preferably used. A modified epoxy resin of these is also used. These may be used singly, or may be used in a combination of two or more.

For the curing agent to be used in combination with the thermosetting resin as described above, a thiol type compound, a modified amine type compound, a multifunctional phenol type compound, an imidazole type compound, and an acid anhydride type compound may be used. These may be used singly, or may be used in a combination of two or more. For the curing agent, a preferable agent is selected according to the environment in which it is to be used and the purpose of the conductive paste.

The conductive paste of the present invention may further contain an additive for adjusting viscosity or adding thixotropy. For the additive, various inorganic or organic materials may be used. For the inorganic material, for example, silica, alumina, and the like are used. For the organic material, for example, a low molecular weight amide compound, a polyester resin, an organic derivative of castor oil, and the like are used. These may be used singly, or may be used in a combination of two or more.

Details of the materials are described below.
(1) First conductive filler: Alloy Particle A as described in each table
(2) Second conductive filler: Alloy Particle B as described in each table
Where
SnBi: $Sn_{42}Bi_{58}$
SnAgCu: $Sn_{96.5}Ag_3Cu_{0.5}$
SnIn: $Sn_{48}In_{52}$
SnCu: $Sn_{99.25}Cu_{0.75}$
SnBiIn: $Sn_{20}Bi_{65}In_{15}$
(3) First flux: Flux A as described in each table
(4) Second flux: Flux B as described in each table
(5) Thermosetting resin: Bisphenol F type epoxy resin, product name "Epikote 806", manufactured by Japan Epoxy Resins Co., Ltd.
(6) Curing agent: Imidazole type curing agent, product name "Curezol® 2P4MZ", manufactured by Shikoku Chemicals Corporation
(7) Additive: Castor oil type additive, product name "THIXCIN R", manufactured by Elementis Japan, K. K.

TABLE 1

| Formulation | Filler Component | Flux Component | Thermosetting Resin | Curing Agent | Additive |
|---|---|---|---|---|---|
| Material | Ref. Table 2A | Ref. Table 2A | Bisphenol F Type Epoxy Resin | Imidazole Type Curing Agent | Castor Oil Type |
| Parts by Weight | 700 | 15 | 100 | 5 | 15 |

In a preferable embodiment of the present invention, the formulation of materials contained in the conductive paste is as follows: 400 to 700 parts by weight of the first conductive filler and the second conductive filler in total, 1 to 100 parts by weight of the curing agent component, 1 to 20 parts by weight of the first flux and the second flux in total, 1 to 20 parts by weight of the additive for viscosity adjustment/thixotropy addition per 100 parts by weight of the thermosetting resin component. However, the present invention is not limited to such a formulation.

In the present invention, the mounting structure includes a substrate, an electronic component mounted on the substrate, and a conductive paste that bonds the electronic component to the substrate. FIG. 1 shows an example of the mounting structure. A mounting structure 1 includes a substrate 2 and an electronic component 3; and the substrate 2 and the electronic component 3 have an electrode 2a and an electrode 3a, respectively. The conductive paste 4 serves as an electrical connection between these electrodes. Although examples of the electronic component include a CCD element, a hologram element, a chip component, and the like, the electronic component is not limited thereto. Such a mounting structure is contained in, for example, devices such as DVDs, mobile phones, portable AV devices, digital cameras, and the like.

EXAMPLES

In the following Examples and Comparative Examples, conductive pastes were prepared by mixing materials according to the formulation shown in Table 1, and the amount of solder ball generated at the time of soldering and the storage stability were evaluated.

The evaluation of the conductive paste was conducted as in the following.

Amount of Solder Ball Generated

A conductive paste was printed on a ceramic substrate using a metal mask having an opening of ϕ3 mm and a thickness of 0.2 mm. The printed conductive paste was put into a heating oven at 160° C. along with the substrate, and heated for 10 minutes, thereby curing the conductive paste. Afterwards, the cured conductive paste was cooled to room temperature along with the substrate. Afterwards, the cured conductive paste was observed with a microscope, and the amount of solder ball generated was evaluated.

The amount of solder ball generated was compared relatively, setting the result of Comparative Example 2 as "medium", and using this as a benchmark.

Storage Stability

A conductive paste was printed on a ceramic substrate, and then allowed to stand for an hour in the air at 25° C. Afterwards, the printed conductive paste was put into a heating oven at 160° C. along with the substrate, and heated for 10 minutes, thereby curing the conductive paste and obtaining sample X. Meanwhile, a conductive paste was printed on a ceramic substrate and was put immediately into a heating oven at 160° C., and heated for 10 minutes, thereby curing the conductive paste and obtaining sample Y.

The amounts of solder ball generated for sample X and sample Y were compared. The smaller the amount of solder ball generated, the better the storage stability of the conductive paste. Storage stability (shelf life) was compared relatively setting the result of Comparative Example 2 as "Δ(medium)", and using this as a benchmark. ◯: long, X: short Examples 1 to 2 and Comparative Examples 1 to 6

The influence of the difference between the melting point of the first flux and the melting point of the second flux on the evaluation results was examined. Alloy particle A and Alloy Particle B were used according to the weight ratios shown in Table 2A, and Flux A and Flux B were used according to the weight ratios shown in Table 2A. The evaluation results are shown in Table 2B.

TABLE 2A

|  | Alloy Particle A | | Alloy Particle B | | Flux A | | Flux B | |
| --- | --- | --- | --- | --- | --- | --- | --- | --- |
|  | Comp. (Melting Point) | Parts by Weight | Comp. (Melting Point) | Parts by Weight | Comp. (Melting Point) | Parts by Weight | Comp. (Melting Point) | Parts by Weight |
| Ex. 1 | SnBi (138° C.) | 610 | SnBiIn (100° C.) | 90 | Diglycolic Acid (142° C.) | 7.5 | Glutaric Acid (98° C.) | 7.5 |
| Ex. 2 | SnBi (138° C.) | 610 | SnBiIn (100° C.) | 90 | Malonic Acid (135° C.) | 7.5 | Glutaric Acid (98° C.) | 7.5 |
| Comp. Ex. 1 | SnBi (138° C.) | 610 | SnBiIn (100° C.) | 90 | Malonic Acid (135° C.) | 7.5 | L-Malic Acid (105° C.) | 7.5 |
| Comp. Ex. 2 | SnBi (138° C.) | 610 | SnBiIn (100° C.) | 90 | Diglycolic Acid (142° C.) | 15 |  |  |
| Comp. Ex. 3 | SnBi (138° C.) | 610 | SnBiIn (100° C.) | 90 | Glutaric Acid (98° C.) | 15 |  |  |
| Comp. Ex. 4 | SnBi (138° C.) | 610 | SnBiIn (100° C.) | 90 | Malonic Acid (135° C.) | 15 |  |  |
| Comp. Ex. 5 | SnBi (138° C.) | 610 | SnBiIn (100° C.) | 90 | L-Malic Acid (105° C.) | 15 |  |  |
| Comp. Ex. 6 | SnBi (138° C.) | 610 | SnBiIn (100° C.) | 90 | L-Malic Acid (105° C.) | 7.5 | Glutaric Acid (98° C.) | 7.5 |

TABLE 2B

|  | Evaluation | |
| --- | --- | --- |
|  | Solder Ball Amount | Shelf Life |
| Ex. 1 | Small | ○ |
| Ex. 2 | Relatively Small | ○ |
| Comp. Ex. 1 | Relatively Large | Δ to ○ |
| Comp. Ex. 2 | Medium | Δ |
| Comp. Ex. 3 | Relatively Large | X |
| Comp. Ex. 4 | Medium | Δ |
| Comp. Ex. 5 | Relatively Large | Δ |
| Comp. Ex. 6 | Relatively Large | Δ |

In all of Examples 1 to 2 and Comparative Examples 1 to 6, Alloy Particle A with a melting point of 138° C. and Alloy Particle B with a melting point of 100° C. were used. Therefore, Examples 1 to 2 and Comparative Examples 1 to 6 satisfy the condition that the melting point of the first conductive filler is higher than the melting point of the second conductive filler by 20° C. or more (Condition 1).

In Examples 1 to 2 and Comparative Example 6, the melting point (98° C.) of Flux B is lower than the melting point (100° C.) of Alloy Particle B. Therefore, Examples 1 to 2 and Comparative Example 6 satisfy the condition that the melting point of the second flux is equal to or less than the melting point of the second conductive filler (Condition 2). On the other hand, in Comparative Example 1, the melting point (105° C.) of Flux B is higher than the melting point (100° C.) of Alloy Particle B, not satisfying Condition 2.

In Examples 1 to 2, the melting point of Flux A is higher than the melting point (100° C.) of Alloy Particle B by 35° C. or 42° C. Therefore, Examples 1 to 2 satisfy the condition that the melting point of the first flux is higher than the melting point of the second conductive filler by 15° C. to 45° C. (Condition 3). On the other hand, in Comparative Example 6, the melting point of Flux A (105° C.) is higher than the melting point of Alloy Particle B (100° C.) by only 5° C., not satisfying Condition 3.

In Examples 1 to 2 and Comparative Example 6, Flux A and Flux B were used in combination with the weight ratio of 1:1. Therefore, Examples 1 to 2 and Comparative Example 6 satisfy the condition that the ratio of the second flux relative to the total of the first flux and the second flux is equal to or less than 50% by mass (Condition 4). This value corresponds to about four times the percentage by mass of Alloy Particle B relative to the total of Alloy Particle A and Alloy Particle B. Therefore, Examples 1 to 2 and Comparative Examples 5 to 6 also satisfy the condition that the ratio of the second flux relative to the total of the first flux and the second flux is 1.5 times or more the percentage by mass of the second conductive filler relative to the total of the first conductive filler and the second conductive filler (Condition 5).

In all of Examples 1 to 2 and Comparative Examples 1 to 6, the ratio of Alloy Particle B relative to the total of Alloy Particle A and Alloy Particle B is 12.6% by mass. Therefore, Examples 1 to 2 and Comparative Examples 1 to 6 satisfy the condition that the ratio of the first conductive filler relative to the total of the first conductive filler and the second conductive filler is 75 to 90% by mass (Condition 6).

With the conductive pastes of Examples 1 and 2 satisfying all of Conditions 1 to 6, the amount of solder ball generated was small and the storage stability of each was excellent. This is probably because Flux A and Flux B effectively worked on the reduction of Alloy Particle A and Alloy Particle B, respectively. When the conductive paste contains only one type of flux, the flux only works on one of the first and the second conductive fillers, and the other of the conductive fillers will probably be in a non-reduced state or re-oxidized. Therefore, the amount of solder ball generated will probably be large.

second conductive filler on the evaluation results was examined. Alloy particle A and Alloy Particle B were used according to the weight ratios shown in Table 3A, and Flux A and Flux B were used according to the weight ratios shown in Table 3A. The evaluation results are shown in Table 3B.

TABLE 3A

|  | Alloy Particle A | | Alloy Particle B | | Flux A | | Flux B | |
| --- | --- | --- | --- | --- | --- | --- | --- | --- |
|  | Comp. (Melting Point) | Parts by Weight | Comp. (Melting Point) | Parts by Weight | Comp. (Melting Point) | Parts by Weight | Comp. (Melting Point) | Parts by Weight |
| Ex. 3 | SnBi (138° C.) | 610 | SnIn (118° C.) | 90 | Malonic Acid (135° C.) | 7.5 | Glutaric Acid (98° C.) | 7.5 |
| Ex. 4 | SnAgCu (219° C.) | 610 | SnBi (138° C.) | 90 | Abietic Acid (173° C.) | 7.5 | Malonic Acid (135° C.) | 7.5 |
| Ex. 5 | SnCu (227° C.) | 610 | SnBi (138° C.) | 90 | Abietic Acid (173° C.) | 7.5 | Malonic Acid (135° C.) | 7.5 |
| Comp. Ex. 7 | SnBi (138° C.) | 610 | SnIn (118° C.) | 90 | Glutaric Acid (98° C.) | 15 | | |
| Comp. Ex. 8 | SnBi (138° C.) | 610 | SnIn (118° C.) | 90 | Malonic Acid (135° C.) | 15 | | |
| Comp. Ex. 9 | SnAgCu (219° C.) | 610 | SnBi (138° C.) | 90 | Malonic Acid (135° C.) | 15 | | |
| Comp. Ex. 10 | SnAgCu (219° C.) | 610 | SnBi (138° C.) | 90 | Abietic Acid (173° C.) | 15 | | |
| Comp. Ex. 11 | SnAgCu (219° C.) | 610 | SnBi (138° C.) | 90 | Diglycolic Acid (142° C.) | 15 | | |
| Comp. Ex. 12 | SnAgCu (219° C.) | 610 | SnBi (138° C.) | 90 | Diglycolic Acid (142° C.) | 7.5 | Malonic Acid (135° C.) | 7.5 |
| Comp. Ex. 13 | SnAgCu (219° C.) | 610 | SnBi (138° C.) | 90 | Abietic Acid (173° C.) | 7.5 | Diglycolic Acid (142° C.) | 7.5 |
| Comp. Ex. 14 | SnAgCu (219° C.) | 610 | SnBi (138° C.) | 90 | Succinic Acid (185° C.) | 1.5 | | |
| Comp. Ex. 15 | SnAgCu (219° C.) | 610 | SnBi (138° C.) | 90 | Succinic Acid (185° C.) | 7.5 | Malonic Acid (135° C.) | 7.5 |
| Comp. Ex. 16 | SnCu (227° C.) | 610 | SnBi (138° C.) | 90 | Malonic Acid (135° C.) | 15 | | |
| Comp. Ex. 17 | SnCu (227° C.) | 610 | SnBi (138° C.) | 90 | Abietic Acid (173° C.) | 15 | | |

In the conductive paste that does not satisfy Condition 2 (Comparative Example 1), because the reduction of Alloy Particle B barely advances until Alloy Particle B reaches its melting point, the amount of solder ball generated probably does not reduce easily.

The storage stability of the conductive paste containing two or more fluxes having different melting points was relatively excellent. In the conductive paste containing two or more fluxes having different melting points, the storage stability improved probably because the amount of flux that reacts at ambient temperature is reduced. On the other hand, shelf life was shortened for the conductive pastes containing only one type of flux.

Examples 3 to 5 and Comparative Examples 7 to 17

The influence of the difference between the melting point of the first conductive filler and the melting point of the

TABLE 3B

|  | Evaluation | |
| --- | --- | --- |
|  | Solder Ball Amount | Shelf Life |
| Ex. 3 | Relatively Small | ○ |
| Ex. 4 | Small | ○ |
| Ex. 5 | Relatively Small | ○ |
| Comp. Ex. 7 | Relatively Large | X |
| Comp. Ex. 8 | Medium | Δ |
| Comp. Ex. 9 | Relatively Large | Δ |
| Comp. Ex. 10 | Medium | ○ to Δ |
| Comp. Ex. 11 | Relatively Large | Δ |
| Comp. Ex. 12 | Relatively Large | Δ to ○ |
| Comp. Ex. 13 | Relatively Large | Δ to ○ |
| Comp. Ex. 14 | Relatively Large | Δ to ○ |

TABLE 3B-continued

|  | Evaluation | |
|---|---|---|
|  | Solder Ball Amount | Shelf Life |
| Comp. Ex. 15 | Relatively Large | Δ to ○ |
| Comp. Ex. 16 | Relatively Large | Δ |
| Comp. Ex. 17 | Medium | Δ to ○ |

From the comparison between Comparative Examples 7 to 17 and Examples 3 to 5, it was clarified that the amount of solder ball generated decreased and storage stability was excellent when Conditions 1 to 6 were satisfied, even though the melting point of the first conductive filler and the melting point of the second conductive filler differed by 20° C., 81° C., or 89° C.

Also, based on Comparative Example 13, it was confirmed that it was necessary for the melting point of the second flux to be equal to or less than that of the melting point of the second conductive filler.

Furthermore, based on Comparative Examples 12 and 15, it was confirmed that it is effective to set the melting point of the first flux to a temperature higher than the melting point of the second conductive filler within the range of +15° C. to +45° C.

Examples 6 to 9

The influence of the ratio of the second flux relative to the total of the first flux and the second flux on the evaluation results was examined. Alloy particle A and Alloy Particle B were used according to the weight ratios shown in Table 4A, and Flux A and Flux B were used according to the weight ratios shown in Table 4A. The evaluation results are shown in Table 4B.

TABLE 4A

|  | Alloy Particle A | | Alloy Particle B | | Flux A | | Flux B | |
|---|---|---|---|---|---|---|---|---|
|  | Comp. (Melting Point) | Parts by Weight | Comp. (Melting Point) | Parts by Weight | Comp. (Melting Point) | Parts by Weight | Comp. (Melting Point) | Parts by Weight |
| Ex. 1 | SnBi (138° C.) | 610 | SnBiIn (100° C.) | 90 (12.8%) | Diglycolic Acid (142° C.) | 7.5 | Glutaric Acid (98° C.) | 7.5 (50%) |
| Ex. 6 | SnBi (138° C.) | 610 | SnBiIn (100° C.) | 90 (12.8%) | Diglycolic Acid (142° C.) | 10.5 | Glutaric Acid (98° C.) | 4.5 (30%) |
| Ex. 7 | SnBi (138° C.) | 610 | SnBiIn (100° C.) | 90 (12.8%) | Diglycolic Acid (142° C.) | 12.3 | Glutaric Acid (98° C.) | 2.7 (18%) |
| Ex. 8 | SnBi (138° C.) | 610 | SnBiIn (100° C.) | 90 (12.8%) | Diglycolic Acid (142° C.) | 13 | Glutaric Acid (98° C.) | 2 (13%) |
| Ex. 9 | SnBi (138° C.) | 610 | SnBiIn (100° C.) | 90 (12.8%) | Diglycolic Acid (142° C.) | 6 | Glutaric Acid (98° C.) | 9 (60%) |

TABLE 4B

|  | Evaluation | |
|---|---|---|
|  | Solder Ball Amount | Shelf Life |
| Ex. 1 | Small | ○ |
| Ex. 6 | Small | ○ |
| Ex. 7 | Relatively Small | ○ |
| Ex. 8 | Medium | Δ to ○ |
| Ex. 9 | Medium | Δ to ○ |

From the comparison among Examples 1, 6, and 7 and Examples 8 and 9, it is clear that excellent results can be obtained when the ratio of Flux B relative to the total of Flux A and Flux B (X % by mass) and the ratio of Alloy Particle B relative to the total of Alloy Particle A and Alloy Particle B (Y % by mass) satisfy the relationship $1.5Y \leq X$. Furthermore, it is clear that excellent results can be obtained when the ratio of Flux B relative to the total of Flux A and Flux B (X % by mass) is equal to or less than 50% by mass. Furthermore, it is clear from Examples 1 and 6 that most preferably 20% by mass $\leq x \leq 50\%$ by mass and $2Y \leq X$ are satisfied.

When the ratio of Flux B is less than the above-described range, the amount of Flux B may be insufficient when Alloy Particle B melts and Alloy Particle A blends into the melted Alloy Particle B, which may increase the amount of solder ball. On the other hand, when the ratio of Flux B is larger than the above-described range, the amount of Flux A that reduces Alloy Particle A at its melting point may be insufficient, which may increase the amount of solder ball.

The conductive paste of the present invention can be applied to a wide range of uses, but particularly is useful when forming a mounting structure included in an electric device or an electronic device. For example, the conductive paste of the present invention is used when forming a mounting structure by bonding electronic components such as CCD elements, hologram elements, chip components, and the like to a substrate. Examples of electric devices or electronic devices provided with such a mounting structure include DVDs, mobile phones, portable AV devices, digital cameras, and the like.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A conductive paste comprising a filler component and a flux component,
    wherein the filler component includes a first conductive filler and a second conductive filler having different melting points, respectively,
    the melting point of the first conductive filler is higher than the melting point of the second conductive filler by 20° C. or more,
    the flux component includes a first flux and a second flux having different melting points, respectively,
    the melting point of the first flux is higher than the melting point of the second flux,
    the melting point of the first flux is higher than the melting point of the second conductive filler by 15° C. to 45° C., and
    the melting point of the second flux is equal to or less than the melting point of the second conductive filler.

2. The conductive paste in accordance with claim 1, wherein the melting point of the first flux is equal to or less than the melting point of the first conductive filler.

3. The conductive paste in accordance with claim 1, wherein the melting point of the first conductive filler is 120 to 140° C., and the melting point of the second conductive filler is 120° C. or less.

4. The conductive paste in accordance with claim 1, wherein the melting point of the first conductive filler is 190 to 230° C., and the melting point of the second conductive filler is 100 to 140° C.

5. The conductive paste in accordance with claim 1, wherein the ratio of the second flux relative to the total of the first flux and the second flux is 50% by mass or less, and 1.5 times or more the percentage by mass of the second conductive filler relative to the total of the first conductive filler and the second conductive filler.

6. The conductive paste in accordance with claim 1, wherein the ratio of the first conductive filler relative to the total of the first conductive filler and the second conductive tiller is 75 to 90% by mass.

7. The conductive paste in accordance with claim 1, wherein the ratio of the first conductive filler relative to the total of the first conductive filler and the second conductive filler is 80 to 90% by mass.

8. The conductive paste in accordance with claim 1, wherein the ratio of the first conductive filler relative to the total of the first conductive filler and the second conductive filler is 85 to 90% by mass.

9. The conductive paste in accordance with claim 1, wherein the first conductive filler includes Sn and Bi.

10. The conductive paste in accordance with claim 9, wherein the Bi content of the first conductive filler is 0.5 to 60 mol %.

11. The conductive paste in accordance with claim 1, wherein the second conductive filler includes Sn and Bi.

12. The conductive paste in accordance with claim 11, wherein the Bi content of the second conductive filler is 55 to 70 mol %.

13. The conductive paste in accordance with claim 1, wherein the first conductive filler and the second conductive filler both include Sn and Bi.

14. The conductive paste in accordance with claim 1, further comprising a thermosetting resin component and a curing agent component.

15. A mounting structure comprising:
    a substrate, an electronic component that is mounted on the substrate, and the conductive paste in accordance with claim 1, the conductive paste bonding the electronic component to the substrate.

16. The conductive paste in accordance with claim 1, wherein the filler component does not include a filler having a melting point higher than a temperature used during soldering to form the conductive paste.

17. The conductive paste in accordance with claim 1, wherein the conductive paste is substantially free of solder balls.

* * * * *